United States Patent
Jakobsen

(10) Patent No.: US 6,510,538 B1
(45) Date of Patent: Jan. 21, 2003

(54) METHOD AND APPARATUS FOR VITERBI DECODING OF PUNCTURED CODES

(75) Inventor: Ken Jakobsen, Vaerlose (DK)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/508,297

(22) PCT Filed: Sep. 15, 1998

(86) PCT No.: PCT/EP98/05847
  § 371 (c)(1),
  (2), (4) Date: Jun. 2, 2000

(87) PCT Pub. No.: WO99/16174
  PCT Pub. Date: Apr. 1, 1999

(30) Foreign Application Priority Data

Sep. 19, 1997 (GB) .............................. 9720046

(51) Int. Cl.[7] .................. H03M 13/35; H03M 13/41
(52) U.S. Cl. ........................ 714/796; 714/790
(58) Field of Search .................. 714/790, 796

(56) References Cited

U.S. PATENT DOCUMENTS

| | | | | |
|---|---|---|---|---|
| 5,151,904 A | * | 9/1992 | Reiner et al. ............... | 714/774 |
| 5,220,570 A | * | 6/1993 | Lou et al. .................... | 341/107 |
| 5,331,665 A | * | 7/1994 | Busschaert et al. .......... | 375/341 |
| 5,396,518 A | * | 3/1995 | How ........................... | 375/244 |
| 5,432,803 A | * | 7/1995 | Liu et al. .................... | 375/340 |
| 5,436,918 A | * | 7/1995 | Kato et al. ................... | 714/795 |
| 5,469,452 A | * | 11/1995 | Zehavi ........................ | 714/792 |
| 5,497,401 A | * | 3/1996 | Ramaswamy et al. ....... | 375/262 |
| 5,566,189 A | * | 10/1996 | Laskowski .................. | 714/746 |
| 5,710,784 A | * | 1/1998 | Kindred et al. ............. | 375/262 |
| 5,931,966 A | * | 8/1999 | Carley ......................... | 360/39 |
| 5,970,104 A | * | 10/1999 | Zhong et al. ................ | 375/341 |
| 6,205,187 B1 | * | 3/2001 | Westfall ...................... | 375/341 |
| 6,289,487 B1 | * | 9/2001 | Hessel et al. ................ | 714/795 |
| 6,374,387 B1 | * | 4/2002 | van den Berghe .......... | 714/790 |
| 6,381,727 B1 | * | 4/2002 | Ikeda ........................... | 714/780 |

FOREIGN PATENT DOCUMENTS

| | | | |
|---|---|---|---|
| GB | 2308044 A | * | 6/1997 |
| WO | WO 93 06550 A | * | 4/1993 |
| WO | WO 96 23360 A | * | 8/1996 |

* cited by examiner

Primary Examiner—Stephen M. Baker
(74) Attorney, Agent, or Firm—Susan L. Lukasik; Steven R. Santema

(57) ABSTRACT

Data for transmission may be convolutionally encoded and punctured prior to transmission. The invention relates to a method and apparatus for decoding such data. In accordance with the invention, a table of error metrics is prepared when a given group (Gt) of n bits is received at a particular time (t). The error metrics (Mti) are calculated for comparisons of the n bits received with each possible permutation (Pi) of n bits. These error metrics (Mti) are placed in the metric table. Next a look-up table (Tt) is consulted which lists each state change (Sj) which the encoder could have undergone at the particular time (t) together with the permutation (Pi) of bits which would have been produced by the encoder for that state change. The look-up table (Tt) is particular to the puncturing scheme which the encoder uses at the particular time (t). The metric table is then used to add to the look-up table (Tt) the error metric (Mti) appropriate to each state change (Si) in the table (Tt). These error metrics are then used to update the cumulative metric of the decoder.

10 Claims, 6 Drawing Sheets

METRIC TABLE

| ROW NUMBER | PERMUTATION OF BITS | METRIC |
|---|---|---|
| 1 | 00 | 2 |
| 2 | 01 | 1 |
| 3 | 10 | 1 |
| 4 | 11 | 0 |

*FIG. 8A*

LOOK-UP TABLE $T_t$

| VECTOR $S_j$ | CORRESPONDING PERMUTATION $P_i$ | METRIC FOUND IN LOOK-UP TABLE |
|---|---|---|
| 00 → 00 | 10 | 1 |
| 01 → 00 | 01 | 1 |
| 00 → 10 | 00 | 2 |
| 01 → 10 | | |
| 10 → 01 | | |
| 11 → 01 | | |
| 10 → 11 | | |
| 11 → 11 | | |

*FIG. 8B*

LIST OF TABLES T TO USE AT A PARTICULAR TIME

| TIME | TABLE NUMBER |
|---|---|
| 1 | 5 |
| 2 | 2 |
| t | $T_t$ |

METHOD AND APPARATUS FOR VITERBI DECODING OF PUNCTURED CODES

TECHNICAL FIELD

The invention relates to the decoding of encoded data. In particular, the invention concerns apparatus and a method for decoding received data which has been convolution encoded and punctured prior to transmission.

BACKGROUND

Convolutional coding is a process by which code is generated from a source signal. The code which is generated consists of bits of data which are derived from the source signal in accordance with the particular convolutional coding scheme in use.

The code generated in a given time period depends on both the data values of the source signal in that time period and the data values of the source signal in preceding time periods. The code is typically generated for transmission in a communication system.

Convolutional coding is used in communication systems to provide signal encryption and to reduce the susceptibility of the system to received bit errors. For example, the Groupe Speciale Mobile (GSM) cellular communication system uses convolutional coding.

A further development of convolutional coding is punctured convolutional coding. Puncturing is an additional process step which is applied to convolutional codes. Puncturing consists of omitting some of the bits from the block of data generated by the convolutional coding. The output data stream resulting from punctured convolutional coding therefore has a lower bit rate than the data stream which would result from mere convolutional coding of the same source signal.

In order to retrieve the source data, the data blocks which result from convolutional coding need at some stage to be decoded. This decoding typically happens after receipt of the data by the receiver to which the data has been transmitted, and is performed by the receiver. A type of decoder called a 'Viterbi' decoder can be used to perform the decoding.

Punctured convolution codes can best be decoded by a Viterbi decoder. However, different puncturing schemes require different decoders. This means that for fast implementation in a device such as a digital signal processor (DSP), the decoder must be specifically designed for the particular puncturing scheme.

This leads to problems in the decoding step. In systems where many different puncturing schemes are used, handcrafting a Viterbi decoder to each puncturing scheme can involve significant effort and hence resources. The multiple decoders may also take up too much code space.

Published patent application GB-A-2 308 044 discloses convolutional encoding of data for transmission in a GSM cellular communication system. The encoded data may be punctured prior to transmission.

The present invention seeks to optimise the decoding of punctured codes.

SUMMARY OF THE INVENTION

A method in accordance with the invention allows the decoding of data which has been convolution encoded, the data consisting of consecutive groups of bits, each group Gt comprising n bits whose values depend on the particular state change St of the data encoder which occurs at a particular time t, the particular state change St being one of a set of possible state changes Sj which the data encoder could have undergone at that particular time t.

The method of decoding data comprises, for the group Gt of n bits received at the particular time t:

a) making comparisons between the n bits of the group Gt and each possible permutation Pi of n bits, and for each comparison, calculating a numerical value for the error metric Mti between the group Gt and the permutation Pi; and b) consulting a pre-calculated look-up table Tt which contains the set of possible state changes Sj, and which indicates for each of these state changes Sj a particular one of the said permutations Pi associated with that state change Sj, and assigning to each state change Sj in the look-up table Tt the metric Mti calculated in step a) for the permutation Pi associated with that state change Sj; and c) using the metric values assigned to the set of possible state changes Sj to update the cumulative metric used to decode the convolution encoded data.

In a preferred embodiment of the method of the invention, the look-up table Tt used at the particular time t may be one of a set of pre-calculated look-up tables, the selection of the particular look-up table Tt for use at a particular time being made in dependence on the puncturing scheme being used by the encoder at that particular time t. Also, the permutation Pi associated with a particular state change Sj in the look-up table Tt may be the group of n bits which the encoder would produce for that particular state change Sj using the puncturing scheme in use at that particular time t. Finally the number of bits n in the particular group Gt may depend on the puncturing scheme being used by the encoder at that particular time t.

In an embodiment of the invention for data transmission, the encoded data may be transmitted after encoding and then received by a receiver prior to decoding.

The invention further comprises a data decoder for decoding data which has been convolution encoded, the data consisting of consecutive groups of bits, each group Gt comprising n bits whose values depend on the particular state change St of the data encoder which occurs at a particular time t, the particular state change St being one of a set of possible state changes Sj which the data encoder could have undergone at that time t.

The data decoder comprises, for the group Gt of n bits received at the particular time t:

a) means MT for making comparisons between the n bits of the group Gt and each possible permutation Pi of n bits, and for each comparison, calculating a numerical value for the error metric Mti between the group Gt and the permutation Pi; and b) means TG for consulting a pre-calculated look-up table Tt which contains the set of possible state changes Sj, and which indicates for each of these state changes Sj a particular one of the said permutations Pi associated with that state change Sj, and for assigning to each state change Sj in the look-up table Tt the metric Mti calculated in step a) for the permutation Pi associated with that state change Sj; and c) means BMC for using the metric values assigned to the set of possible state changes Sj to update the cumulative metric used to decode the convolution encoded data.

In a preferred embodiment of the data decoder of the invention, the look-up table Tt used at the particular time t may be one of a set of pre-calculated look-up tables and the means TG for consulting a pre-calculated look-up table Tt selects the particular look-up table Tt for use at a particular time t in dependence on the puncturing scheme being used by the encoder at that particular time t. The permutation Pi associated with a particular state change Sj in the look-up table may be the group of n bits which the encoder would produce for that particular state change Sj using the puncturing scheme in use at that particular time t. The number of bits n in the particular group Gt may depend on the puncturing scheme being used by the encoder at that particular time t.

In an embodiment of the invention for data transmission, a receiver for receiving encoded, punctured data, may comprise a data decoder in accordance with the invention or any of the preferred embodiments detailed above.

BRIEF DESCRIPTION OF THE DRAWINGS

FIGS. 8A–8C shows examples of tables, including numerical values, which might be generated in an example of a practical implementation of the invention.

DETAILED DESCRIPTION OF THE PREFERRED EMBODIMENT

Figure 1:
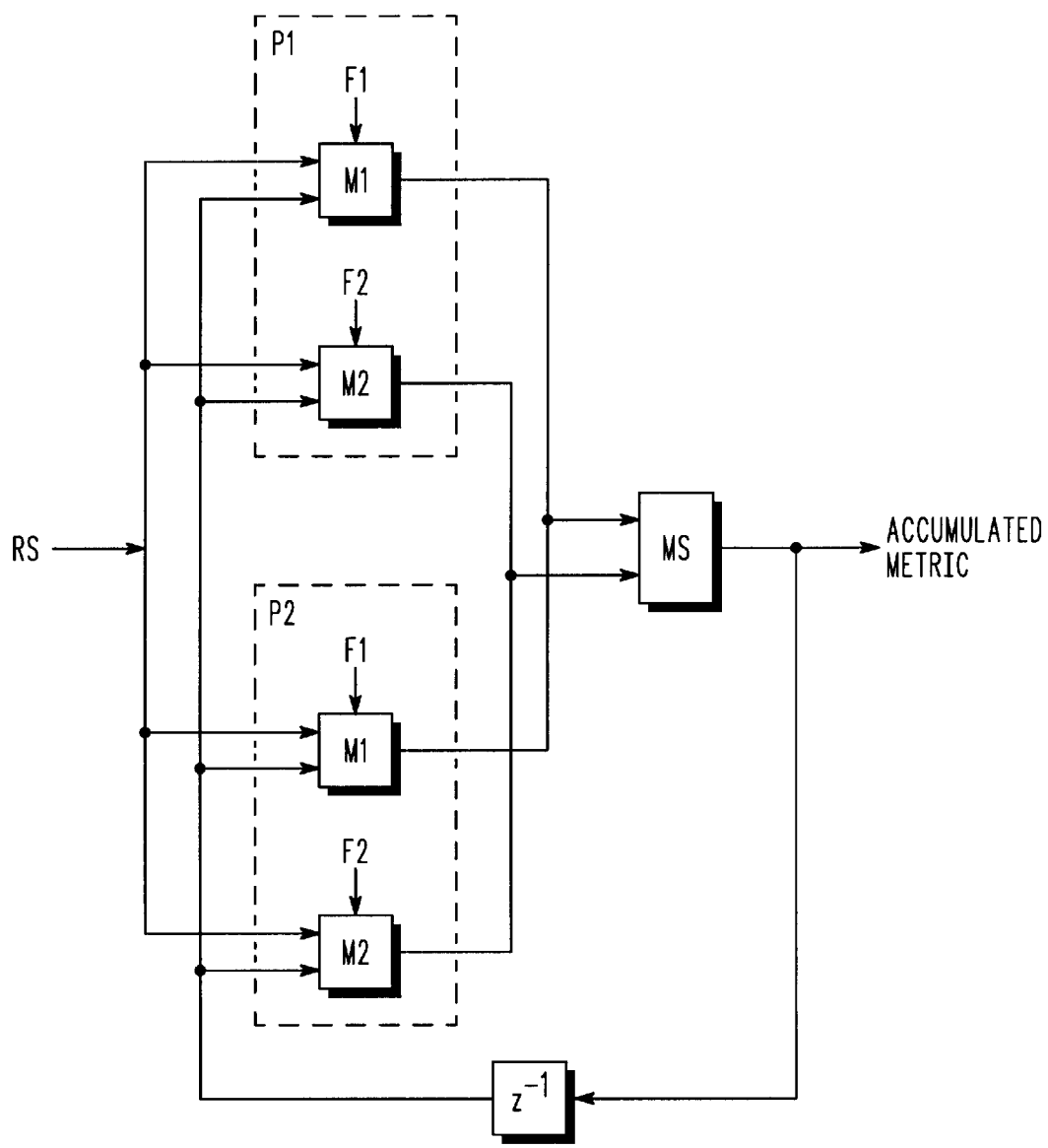
FIG. 1 shows a decoder in accordance with the prior art.

FIG. 1 shows a prior art decoding arrangement.

The input signal to the decoding arrangement of FIG. 1 is a punctured, encoded signal. This may, for example, have been received by a receiver from a transmitter.

The puncturing scheme, i.e. the type of puncturing which was used to form the input signal, is known. This puncturing scheme may however be different at different times. Therefore the arrangement of FIG. 1 is shown with two boxes, P1 and P2, each of which is only active for a particular puncturing scheme. In practice, there are as many such boxes in the arrangement as there are puncturing schemes which the encoder may use. Only one such box is active at one time.

Considering once more the example of the transmitter and receiver, the receiver knows which puncturing scheme was used by the transmitter at a particular time. This allows the receiver to activate the particular box Pi which corresponds to the puncturing scheme which was originally applied to the portion of code now being received.

Consider now a given box, e.g. box P1. The box processes the incoming code by comparing the incoming code with a number of different fixed signals in different branches. See fixed signals F1 and F2 in FIG. 1. The elements marked M1 and M2 on FIG. 1 carry out the comparing. Each such element calculates an error pattern as the result of the comparison which it performs. This error pattern represents the amount of difference that exists between the incoming code and the fixed signal.

The error pattern is analysed to produce a numerical value which represents the amount of difference between the incoming code and the fixed signal. This numerical value is referred to as the 'metric'. Each of the elements such as M1 and M2 produces a metric, and these elements are referred to as metric calculators.

Each fixed signal F represents a portion of code which the incoming signal might resemble. As the metric is a measure of difference, the metric which will be output by a metric calculator is lower when the fixed signal input to that particular metric calculator and the incoming code most resemble each other.

As shown in FIG. 1, the same incoming code is supplied to all the boxes marked P and to all the metric calculators M within each box. This incoming code is therefore simultaneously compared to a number of different fixed signals in the particular box Pi which is active. Thus by selecting the lowest metric of those output by the particular box Pi, the arrangement of FIG. 1 indicates which fixed signal that portion of the input signal code most closely resembles. This latter selection is performed by the element marked MS, which performs minimum selection amongst the various metrics output by the active box Pi.

Clearly, if there are p different punctuation schemes in use in the system, there will need to be p different boxes P. If comparison of the received signal with m different fixed signals F is required, then there must be m different metric calculators M. A single minimum selector MS is used.

The output of the particular box of FIG. 1 which is active at any time is used to update the accumulated metric of the decoder. This is the metric held by the decoder as a result of all the earlier state changes which have been communicated to it from the encoder. The signal which is output at the right extremity of FIG. 1 is the accumulated metric.

In transmission systems where blocks of code of finite length are transmitted, decoding can be performed by an arrangement of the form of that shown in FIG. 1 for each block of code in succession.

In practice however, an encoded signal will be transmitted as a continuous stream of bits. The decoding is then an on-going process. In fact, the decoder takes on the form of a state machine, whose state is updated as bits of encoded data are received. The state of the decoder at any point in time depends on the changes which occurred in the encoder up until that time point. The state of the decoder is thus indicative of those changes.

In a decoder with a continuous stream of incoming bits, each group of incoming bits is still compared to a set of values which those bits could have taken. Each of the comparisons results in a metric. This metric is then summed with the cumulative metric up to that point in time. At any one time therefore, the metric calculation is done for part of the received signal and decoding a continuous received signal involves repeating the entire metric calculation many times. Each calculation of the metric will influence the decoder. Once these calculations have been done, the original source signal is derived by examining how the decoder's state has evolved.

The prior art arrangement of FIG. 1 must carry out a great deal of calculation. This is both in order to find the fixed signal which most closely resembles the incoming portion of code at a particular instant, and to repeat these calculations for new code which arrives. The prior art arrangement needs sufficient calculation power to do the decoding inside the time window in which the result is relevant. If such calculating power is not available, then the decoding will not be possible.

The present invention replaces the arrangement of FIG. 1 and improves upon the prior art arrangements. Aspects of the invention are illustrated in FIGS. 4–7.

The algorithm according to the invention will in particular tend to reduce the calculation power required for most punctuation schemes. It offers the further advantage of reducing the coding effort needed with multiple punctuation schemes. This reduction is of particular advantage in communication systems such as TETRA.

Figure 2:
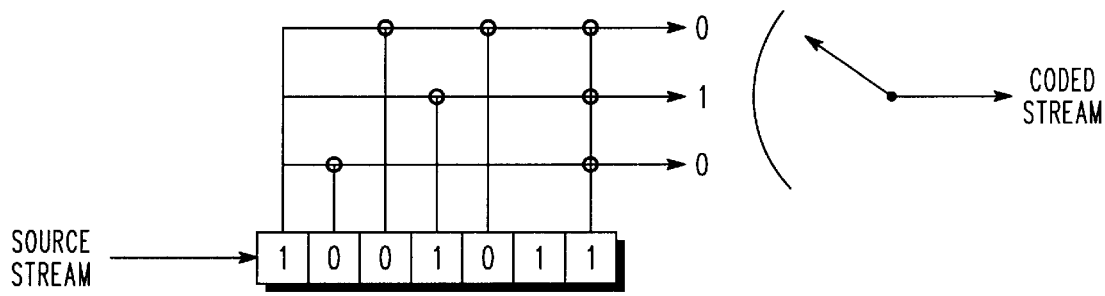
FIG. 2 shows an example of a simple encoder.
Figure 3:
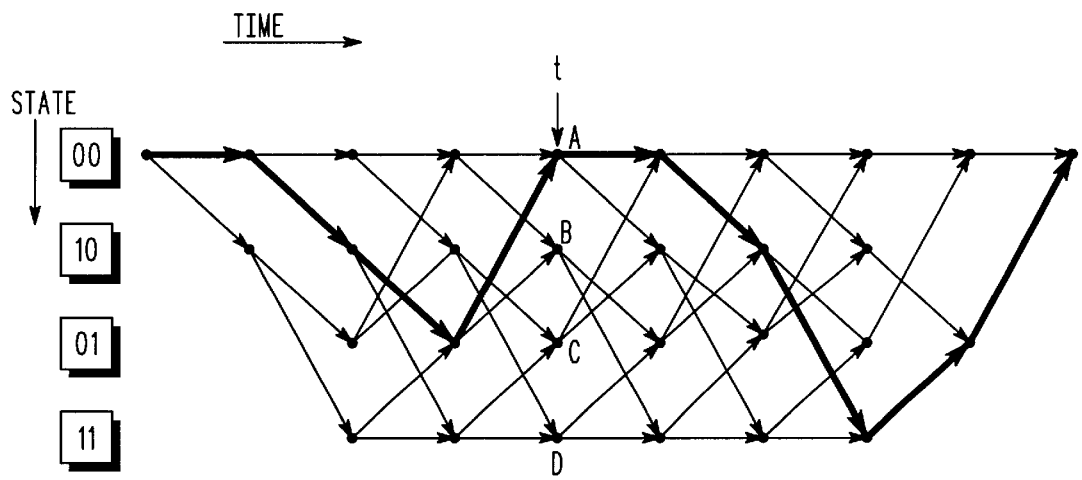
FIG. 3 shows the possible and the actual development of states of a state machine.

FIGS. 2 and 3 are provided to illustrate the idea of encoders and decoders being 'state machines', whose states change with time. In the example of a communication system where encoding of data takes place prior to transmission, the state of the encoder depends on the bits fed to it for encoding. The state of the decoder depends on the groups of bits fed to it by the receiver.

FIG. 2 shows a simple encoder. The encoder receives raw data for encoding, marked as 'Source stream' at the left of the figure. As each bit of data arrives, the data is entered into a shift register. The register is tapped by the network of taps and adders shown above the shift register.

Three bits are shown at the right of the network. These are the bits output by the network. As an example, the upper of the three output bits is a 0 (zero). This results from taps to the first, third, fifth and seventh bits of the shift register. As two of these four positions in the register are occupied by a 1 (one) and the other two positions are occupied by a 0 (zero), the adders lead to an output of 0 (zero) by binary addition in modulo 2.

The other two bits output by the network are derived analogously by the adders and taps connected to the middle and lower horizontal wires of the network respectively.

To the extreme right of the figure is shown a simple parallel to serial converter. This converter derives the bit stream which constitutes the output of the encoder.

In operation, new bits of data of the source stream arrive as time progresses. Each new bit is added to the left-most place of the shift register. The remaining bits in the shift register are moved one place to the right. Clearly when this happens, the inputs to the network above the shift register will change. The three bits output by the network will change correspondingly.

Thus, for each new bit of data arriving for encoding, a group of three bits is generated by the encoder. Each of the three bits depends for its value on more than just the most recent data bit to arrive. Thus convolutional encoding has been implemented. Note that three bits are output by the encoder for each data bit which arrives for encoding. This is a rate ⅓ code.

The step of puncturing the coded output data stream consists of omitting some of the output data bits. This might typically be done before transmission of the encoded stream. The puncturing reduces the number of encoded bits which need to be transmitted, and therefore reduces the bandwidth required for transmission.

The puncturing scheme is the process by which the puncturing is done. Looking at FIG. 2, a puncturing scheme could consist of omitting the bit output by the lower of the three horizontal wires of the network. Thus only the upper two bits would be transmitted in this example, reducing the bandwidth required for the transmission by one third.

Clearly the recipient of the encoded data, here the receiver of the transmitted data, must know which puncturing scheme was used by the encoder at the time concerned.

FIG. 3 shows the development of states of a state machine. Starting at the left of the figure, the first point on the figure represents the starting condition of a state machine. This machine could be the encoder.

The symbols '00' to the left of this point on FIG. 3 represent a definition of the state concerned. The output bits of the decoder depend on this state. When a data bit arrives at the encoder for encoding, the bit values produced at the outputs change.

The second column of FIG. 3, consisting of two points, represents the two possible states which the encoder could be in after the arrival of the first data bit for encoding. The encoder could thus remain in the '00' state, or could progress to the '10' state, depending on whether a 1 or a 0 arrives for encoding.

Note that FIG. 3 does not concern the same encoder as was used in the simple example of FIG. 2. Furthermore, the two bits defining each state in FIG. 3 have been produced by puncturing the bits output by an encoder, so bear no simple relationship to the sequence of data bits input to the encoder.

The third column of FIG. 3 shows that there are four possible states of the encoder after a second bit of data has been supplied to the encoder. The bit values output by the encoder at the time of this transition depend both on the initial and final states of the encoder.

The arrows in FIG. 3 illustrate that the state of the encoder can only change to one of a particular pair of new states when starting from a given state. These arrows have been added to FIG. 3 to show the permissible state transitions at each point in time. For example, staring from '10' in the second column, the two lightly shaded arrows show that the state can only change to '01' or '11'. At the time of this transition, the encoder would output either the bits for the transition '10' to '01' or those for the transition '10' to '11'. The arrows on FIG. 3 thus generally provide an indication which bits can be generated by the encoder when starting from a particular state.

The thicker, darker arrows on FIG. 3 show the progression between states which an encoder might follow over time in a real case. The bits which are encoded and transmitted to the receiver allow the decoder to 're-construct' this progression of states. Because the decoder is able to deduce the sequence of the encoder's states, it is able to deduce the bits of data of the source stream which caused the encoder to progress through those states. Thus the decoder can re-construct the source stream, and by doing this has decoded the data.

Finally in relation to FIGS. 2 and 3, it should be noted that errors occur in a bit stream which is transmitted to a receiver. Because of these errors, the state of the decoder is only an approximation to the state of the encoder. Assuming that FIG. 3 is representative of the exact progression of states which the encoder follows, then the decoder will derive a number of error metrics and, at any one time, the cumulative metric of lowest value shows the set of states which the encoder is most likely to have occupied.

In order to understand the invention, consider now the arrival at the decoder of a portion of incoming code at a particular time t. The portion of code comprises n bits. In the prior art arrangement of FIG. 1 this actual received code would need to be compared in the metric calculators M1, M2 etc. to the possible permutations which it could have taken. Each of these comparisons would result in an error pattern and for each of these error patterns a metric would need to be calculated. Finally the element MS in FIG. 1 would find the minimum metric.

In accordance with the invention however a different procedure is followed. This procedure is illustrated in FIGS.

4–7. Firstly, the metrics Mti are calculated between the n bits of code received at time t and all the possible permutations of that number n of bits. Each metric Mti is then stored together with the permutation Pi of n bits for which it was calculated. This storage is in a 'metric table'.

The n bits of code in the received group of bits Gt depend for their value on the state change St of the encoder occurring at the particular time t. However, the received bits may contain errors, which typically arise during transmission. Therefore the dependence of the values of the n bits on the state change St cannot be relied upon.

Next, reference is made to a look-up table Tt. This is one of a set of tables T, each of which is pertinent to a particular punctuation scheme used by the encoder. The contents of table Tt are specific to the punctuation scheme which is being used by the encoder at time t.

Look-up table Tt contains the list of all possible state changes Sj which the encoder could have undergone at time t. Each state change Sj is represented by the particular permutation Pi of n bits which the encoder would have transmitted at time t had that state change occurred. For each of these permutations Pi in table Tt, it is now possible to look in the metric table for the value of the metric Mti which corresponds to the permutation concerned. Significantly, no calculation of the error pattern or metric is necessary at this point.

When metrics Mti have been assigned to all the state changes in table Tt, the arrangement according to the invention now has a list of metrics. These metrics Mti are used to update the cumulative metric for the decoder, i.e. to perform the state update.

The advantage of the arrangement in accordance with the invention is that it requires far less calculation power for incoming code portions which consist of large numbers n of bits. It can also cope far more easily with a large number of different puncturing schemes.

Looked at in its broadest sense, a metric table of metrics Mti is first calculated and then used to determine what the update to the state metric of the decoder should be.

Note that the metrics Mti are only calculated once, for any particular group of n bits which arrives at a time t.

An efficient set of look-up tables T can be used to tailor the decoding to an arbitrary punctuation scheme. The table T gives the information about which row of the metric table should be consulted to find the metric Mti for each state change Sj recorded in the table T. For each possible punctuation scheme there is a table T. The decoder knows which punctuation scheme is being used by the encoder at a time t, so it knows which look-up table Tt to use at that particular time. For each additional punctuation scheme it is only necessary to have a further table T. When that punctuation scheme is being used by the encoder, the decoder simply uses the appropriate table T. As a result of this, a common decoder can then be used for many different punctuation schemes.

In prior art schemes, it is usual to use the Viterbi decoding algorithm to arrive in an efficient manner at the state updates of the decoder. According to the invention, the basic idea is first to calculate all possible metrics Mti to be used in a state update in advance of each state update. The term 'state update' means the 'add-compare-select' operation of a Viterbi decoder.

The 'add' part here according to prior art arrangements required a metric calculation between the received signal and the fixed signal on the particular branch concerned.

According to the arrangement of the invention, instead of calculating the metric in the "add" part of the state update, the metric can be found by consulting the table of calculated metrics. The process of the invention is made dependant on both the state change which occurs and the punctuation scheme by having a two stage lookup. One lookup resolves the problem of punctuation by using a particular table Tt, and one lookup actually retrieves the metric Mti from the metric table.

The metric table itself contains the results of the metric calculations which have been done in advance. In fact, the table should contain the results of calculations of all possible metrics for a group Gt of n received bits.

Figures 4, 5:
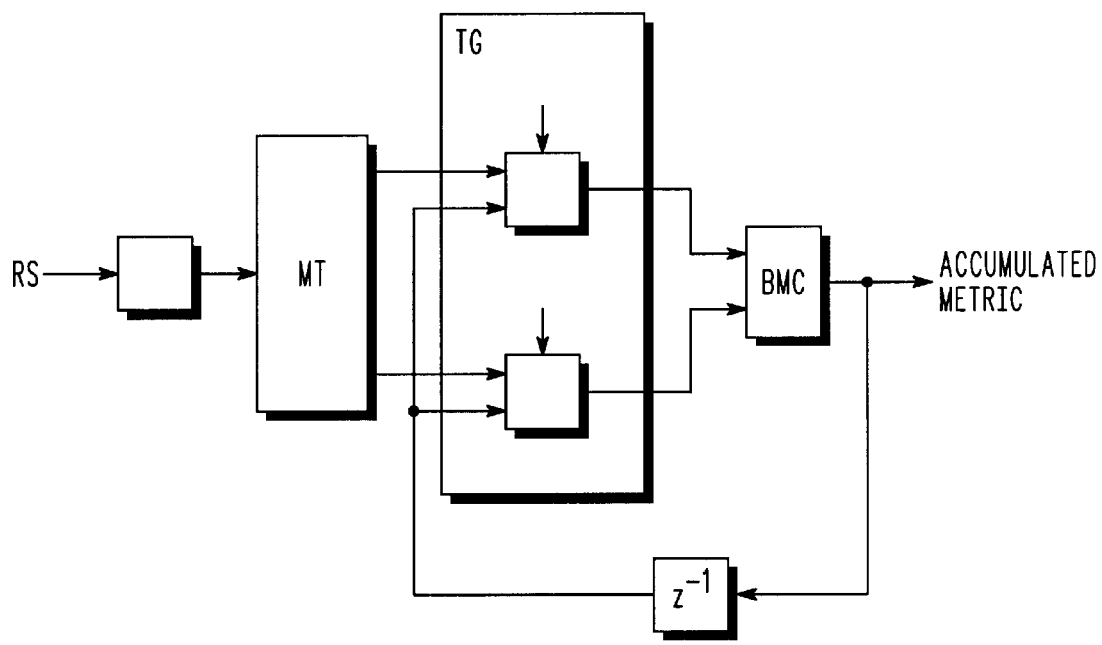
FIG. 4 shows the calculation of metrics for eight possible permutations of three bits.
FIG. 5 shows a decoder in accordance with the invention.

An example of the calculation of a look-up table is shown in FIG. 4. FIG. 4 relates to a three bit transfer, where three bits represent each state change. There are eight permutations of bit values shown in the larger of the two matrices. These eight permutations are all the possible permutations of three bits, which bits themselves can only take one of two values. Here the possible values are either 1 or −1. The number of permutations will in general be $2^n$, where n is the number of binary valued bits in the group Gt received.

The example of FIG. 4 shows the calculation of the metrics for the three bits bit(1), bit(2) and bit(3) received at a particular time t. In the example shown in FIG. 4 the metric will have the maximum value 3 only for the one group of three bits in the larger matrix which exactly matches the three bits actually received at the time t. The other seven permutations in the larger matrix will all result in metrics of lower value because each has at least one bit which is not the same as the received bit in the corresponding position. Although the example in FIG. 4 actually results in the permutation which most closely corresponds to the received bit group having the highest metric, it is clear that in general the permutation which corresponds to the group of n bits received is identifiable because it has an extreme value of metric. The references to 'lowest metric' with respect to the figures should be taken as meaning the metric which indicates the closest correspondence between the permutation concerned and the bit group received.

The table calculated as shown in FIG. 4 then provides the information required to carry out the state update of the decoder.

The apparatus for carrying out the state update can be seen from FIG. 5. FIG. 4 shows the operation of element MT of FIG. 5. In element MT a metric table is calculated for the latest group Gt of n bits of the received signal.

The element of the figure marked TG indicates a table-guided update. Table Tt contains the possible state changes Sj of the encoder, together with the permutation of bits Pi which each would produce, for the particular punctuation scheme in use by the encoder at the time t. Means TG fetches the metric Mti for each possible state change Sj from the metric table which has been produced in element MT. The two branches shown in the element TG indicate that two additions are made at one time. Here the values of two metrics are taken from the look-up table at one time, and each is added to a cumulative metric. This procedure must be repeated for each possible state change Sj, and is only shown as being carried out two additions at a time for illustrative purposes. The result is a number of different cumulative metrics.

Box BMC selects the cumulative metric which now represents the best match between the possible state changes which may have occurred in the encoder and the groups G of n bits which have been received by the decoder. This best metric consists of a sequence of possible state changes and represents the most likely sequence of state changes that the encoder has undergone.

The output at the right extreme of FIG. 5 is the accumulated metric. This corresponds to the output at the same point on prior art FIG. 1. This output is however achieved with less calculation power being required. There is also less difficulty when there are a large number of possible punctuation schemes than is the case with the arrangement of FIG. 1.

Figure 6:
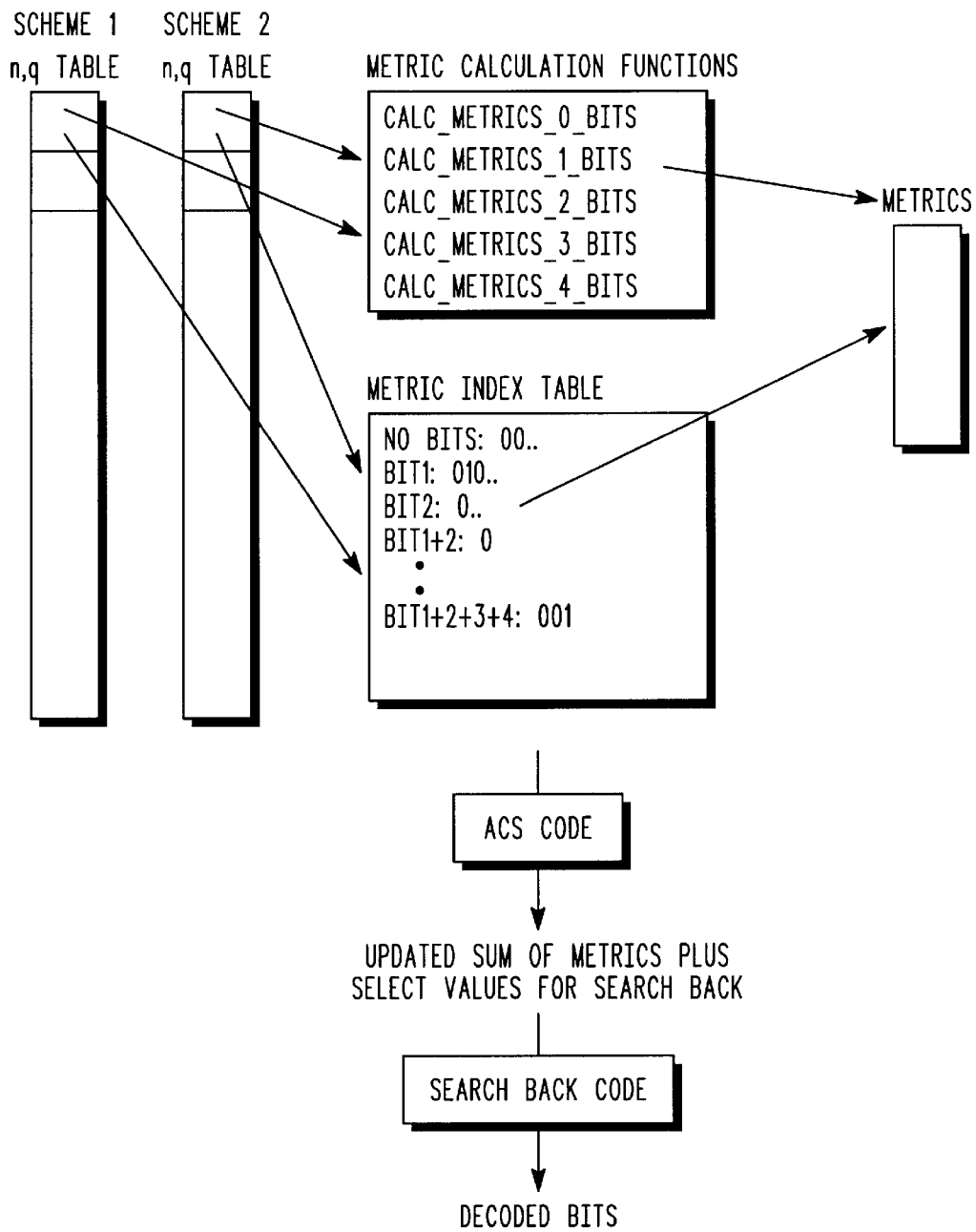
FIG. 6 shows a scheme in accordance with the invention for decoding received data.

FIG. 6 shows a generalised method of constructing a metric table and performing the method of the invention. This implementation is suited for fast implementation in e.g. a DSP. This replaces calculation, by using instead table lookup wherever possible.

The two columns on the left of FIG. 6 relate to two different punctuation schemes. An entry in a row of either column indicates that the punctuation scheme of that column is active at the time corresponding to that row. Each successive row in the two columns is thus the active/inactive indication for that punctuation scheme at successively later times t.

The information from the two columns at the left of FIG. 6 determines which parts of the 'Metric calculation functions' and the 'Metric index table' boxes in the centre of the figure are selected to calculate the metrics. These metrics are assembled in the box at the right of FIG. 6. The 'Metric index table' box lists which punctuation scheme is being used at each particular time.

The box towards the lower part of FIG. 6 marked 'ACS code' represents the 'Addcompare-select' operation. This operation updates each accumulated metric. The accumulated metrics provide a history of the state changes in the encoder. They thus can be used to provide the search back code, which is a record of the changes in the encoder which can be used to decode the transmitted bits of data.

Figure 7:
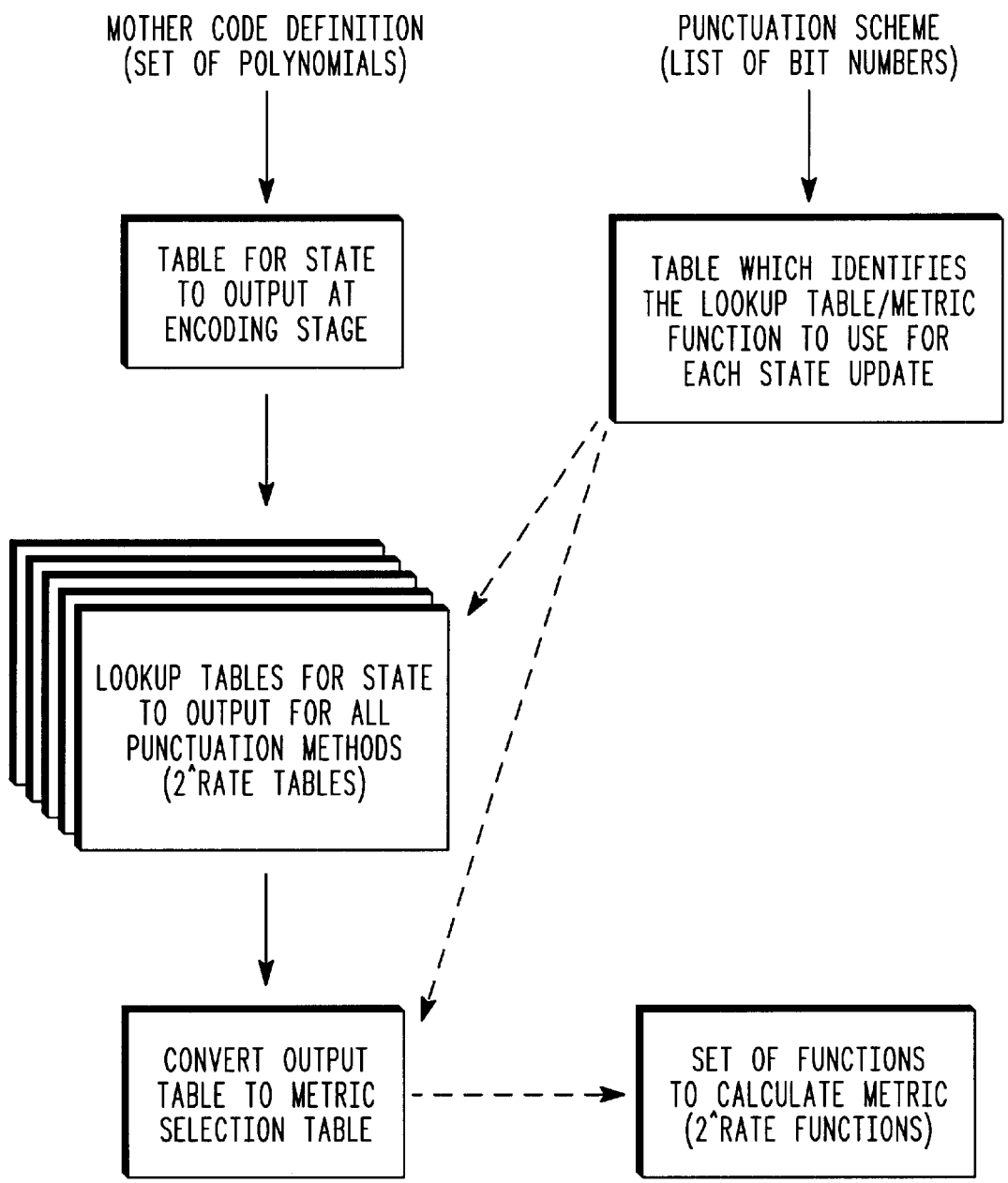
FIG. 7 shows a scheme for constructing tables of use in the invention.

FIG. 7 shows a detailed method for constructing the look-up tables T of the invention. The method relies on knowledge of both the encoding scheme and the punctuation schemes which were used by the encoder.

The upper left box consists of a table which the encoder uses to determine which state change to output for a given set of input bits at the encoding stage. From this table and information about the punctuation schemes from the box at the upper right of the figure, the multiple tables T at the centre left of FIG. 7 are derived. These tables are used by the decoder to decide on the state change which would be output for a given set of input data and using the punctuation scheme chosen at that time. These tables thus show which bits of code are generated for a given input bit stream at a given time. In a communication scheme, it is these bits of code which should be transmitted and then received by a receiver which must decode them.

The multiple tables at the centre left of FIG. 7 allow the generation of the tables Tt of the invention. For a given punctuation scheme, one of the tables at the centre left of FIG. 7 contains details of which bit patterns will be output by the encoder for a given state change. This information is clearly sufficient to create a table Tt, appropriate to that punctuation scheme, which lists the bit pattern which will be output for each state change. Thus creation of the tables T can be seen simply as a re-ordering of information. One such table T is created for each punctuation scheme.

According to the invention, the information in each table T is used together with the table of metrics calculated for each arriving group Gt of n bits of received data in order to carry out the state update of the decoder.

Summarising FIG. 7, the tables T are derived from the mother code definition and the punctuation definitions.

The inventive method can be implemented by a variety of suitable apparatus. In particular, a digital signal processor would be suitable. Most important is the ability of the hardware chosen to be able to access stored data quickly. This is because of the emphasis in the apparatus and method in accordance with the invention on looking up metric values in a metric table rather than performing the large volumes of calculations which the prior art arrangements would require.

The primary calculation demand at any particular time t will be to create the metric table. This metric table is then accessed repeatedly in dependence on the values stored in the look-up table Tt appropriate to the puncturing scheme in use at that time.

EXAMPLE

FIG. 8 shows an example of the method of the invention. In particular:

FIG. 8a shows an example of a simple metric table;

FIG. 8b shows an example of the look-up table Tt of permutations (Pi) of bits which correspond to the possible state changes (Sj) of the encoder for a particular punctuation scheme;

FIG. 8c shows a list of look-up tables T corresponding to the different puncturing schemes which the encoder can employ, listed together with the times at which that puncturing scheme is used.

In the example of FIG. 8, two encoded bits are received by the decoder at any time t. In the terminology used above in connection with FIG. 4, here n=2.

The centre column of the table of FIG. 8a shows the four permutations of two bits which are possible, and therefore which the decoder might receive at any time.

At the time t concerned in the example of FIG. 8, the decoder actually receives the bits '00'. These two bits are then compared with each of the four possible permutations in the centre column of FIG. 8a. For each of these four comparisons, a metric is calculated. These metrics are shown in the right column of FIG. 8a. The metric '2' for the permutation '00' in the centre column indicates exact correspondence between the two bits received and those bits in the centre column.

The permutations '01' and '10' both lead to a metric of 1, because each has one bit identical to the '00' received, and one bit which differs. Neither of the bits of the combination '11' in the centre column agrees with the bits received, so the metric is 0.

The metric calculation in the example of FIG. 8a simply consists of checking the correspondence of the bits received by the decoder with those of the possible permutations of that number of bits. Other calculation schemes are possible.

The left column of FIG. 8b shows the eight possible state transitions of an encoder. These state transitions are made at a time t. They are in fact taken from the example of FIG. 3. Reference should now be made to FIG. 3. Here the time point t has been marked. Also marked at time t are the possible initial states in which the encoder could find itself at time t. These are marked as A,B,C and D. The eight state changes in the left column of FIG. 8b correspond to the eight permitted transitions from the four possible initial states A,B,C, and D. Each of these eight transitions corresponds to one of the lightly shaded arrows on FIG. 3 between one of points A,B,C or D and one of the points in the next column to the right.

The central column of the look-up table Tt in FIG. 8*b* gives the particular combination of two bits which the encoder would produce for each of the eight state changes in the left column. The particular combination depends on the mother code definition for the encoding and the puncturing scheme being used at time t.

Only three permutations of two bits are listed for the purposes of illustration in the central column of FIG. 8*b*. In the right column of FIG. 8*b* the metrics are shown which correspond to the two bit combinations in the centre column. These metrics have been copied from those in the right column of the metric table of FIG. 8*a*, as explained earlier in accordance with the method of the invention.

FIG. 8*c* shows for completeness the list of tables T, each listed together with the time at which it should be employed by the decoder. The list of tables is in the right column of FIG. 8*c*. The time at which each table should be used, expressed in arbitrary units, is in the left column of FIG. 8*c*. For example, at time 1 the fifth table should be used because the puncturing scheme appropriate to the fifth table is being used by the encoder at this time. The significance of the time in the left column is that it is the time at which a state change of the encoder occurs, and at which a new group Gt of n bits related to that state change is received by the receiver and decoder.

The advantages of the invention are clear. In a case where the encoder may start in a large number of states, the number of possible transitions in the left column of the look-up table of FIG. 8*b* could be very large. However, the method of the invention leads to a metric value for each of these transitions simply by accessing the row of the metric table which contains the metric for that permutation. A look-up replaces the calculation necessary with prior art arrangements, such as using the metric calculators of the arrangement in FIG. 1.

The second advantage of the invention is that many different puncturing schemes can be used by the encoder. For each puncturing scheme, a different table T is required. However, this is a far simpler arrangement than requiring an entirely new decoding algorithm for each different puncturing scheme, as would be the case with prior art arrangements.

What is claimed is:

1. A method of decoding data which has been convolution encoded, the data consisting of consecutive groups of bits, each group (Gt) comprising n bits whose values depend on the particular state change (St) of the data encoder which occurs at a particular time (t), the particular state change (St) being one of a set of possible state changes (Sj) which the data encoder could have undergone at that particular time (t), the method of decoding data comprising, for the group (Gt) of n bits received at the particular time (t):

a) making comparisons between the n bits of the group (Gt) and each possible permutation (Pi) of n bits, and for each comparison, calculating a numerical value for the error metric (Mti) between the group (Gt) and the permutation (Pi); and b) consulting a pre-calculated look-up table (Tt) which contains the set of possible state changes (Sj), and which indicates for each of these state changes (Sj) a particular one of the said permutations (Pi) associated with that state change (Sj), and assigning to each state change (Sj) in the look-up table (Tt) the metric (Mti) calculated in step a) for the permutation (Pi) associated with that state change (Sj); and c) using the metric values assigned to the set of possible state changes (Sj) to update the cumulative metric used to decode the convolution encoded data.

2. A method as claimed in claim 1, wherein the look-up table (Tt) used at the particular time (t) is one of a set of pre-calculated look-up tables, the selection of the particular look-up table (Tt) for use at a particular time being made in dependence on the puncturing scheme being used by the encoder at that particular time (t).

3. A method as claimed in either claim 1 or claim 2, wherein the permutation (Pi) associated with a particular state change (Sj) in the look-up table (Tt) is the group of n bits which the encoder would produce for that particular state change (Sj) using the puncturing scheme in use at that particular time (t).

4. A method as claimed in any of claims 1–3, wherein the number of bits n in the particular group (Gt) depends on the puncturing scheme being used by the encoder at that particular time (t).

5. A method as claimed in any of claims 1–4, wherein the encoded data is transmitted after encoding and then received by a receiver prior to decoding.

6. A data decoder for decoding data which has been convolution encoded, the data consisting of consecutive groups of bits, each group (Gt) comprising n bits whose values depend on the particular state change (St) of the data encoder which occurs at a particular time (t), the particular state change (St) being one of a set of possible state changes (Sj) which the data encoder could have undergone at that time (t), the data decoder comprising, for the group (Gt) of n bits received at the particular time (t);

a) means (MT) for making comparisons between the n bits of the group (Gt) and each possible permutation (Pi) of n bits, and for each comparison, calculating a numerical value for the error metric (Mti) between the group (Gt), and the permutation (Pi); and b) means (TG) for consulting a pre-calculated look-up table (Tt) which contains the set of possible state changes (Sj), and which indicates for each of these state changes (Sj) a particular one of the said permutations (Pi) associated with that state change (Sj), and for assigning to each state change (Sj) in the look-up table (Tt) the metric (Mti) calculated in step a) for the permutation (Pi) associated with that state change (Sj); and c) means (BMC) for using the metric values assigned to the set of possible state changes (Sj) to update the cumulative metric used to decode the convolution encoded data.

7. A data decoder in accordance with claim 6, wherein the look-up table (Tt) used at the particular time (t) is one of a set of pre-calculated look-up tables and the means (TG) for consulting a pre-calculated look-up table (Tt) are adapted to select the particular look-up table (Tt) for use at a particular time (t) in dependence on the puncturing scheme being used by the encoder at that particular time (t).

8. A data decoder in accordance with claim 6 or claim 7, wherein
the permutation (Pi) associated with a particular state change (Sj) in the look-up table is the group of n bits which the encoder would produce for that particular state change (Sj) using the puncturing scheme in use at that particular time (t).

9. A data decoder in accordance with any of claims 6–8, wherein
the number of bits n in the particular group (Gt) depends on the puncturing scheme being used by the encoder at that particular time (t).

10. A receiver for receiving encoded, punctured data, the receiver comprising a data decoder in accordance with any of claims 6–9.

\* \* \* \* \*